US012174553B2

(12) United States Patent
Lee et al.

(10) Patent No.: US 12,174,553 B2
(45) Date of Patent: Dec. 24, 2024

(54) SUPPORT UNIT, BAKE APPARATUS AND SUBSTRATE TREATING APPARATUS INCLUDING THE SAME

(71) Applicant: SEMES CO., LTD., Cheonan-si (KR)

(72) Inventors: Tae Hoon Lee, Osan-si (KR); Jong Gun Lee, Yeosu-si (KR); Ki Sang Eum, Cheonan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 216 days.

(21) Appl. No.: 17/848,841

(22) Filed: Jun. 24, 2022

(65) Prior Publication Data
US 2022/0413397 A1  Dec. 29, 2022

(30) Foreign Application Priority Data
Jun. 25, 2021 (KR) .................. 10-2021-0083358

(51) Int. Cl.
*G03F 7/00* (2006.01)
*G03F 7/38* (2006.01)
*H01L 21/67* (2006.01)

(52) U.S. Cl.
CPC ............ *G03F 7/70825* (2013.01); *G03F 7/38* (2013.01); *H01L 21/67178* (2013.01)

(58) Field of Classification Search
CPC .. H01L 21/6875; H01L 21/68735; G03F 7/38
See application file for complete search history.

(56) References Cited

U.S. PATENT DOCUMENTS

| 2005/0117141 A1* | 6/2005 | Ottens ................. G03F 7/70825 355/75 |
| 2006/0102849 A1* | 5/2006 | Mertens .................. G03F 7/707 250/440.11 |
| 2014/0091512 A1* | 4/2014 | Lin ..................... H01L 21/6875 269/296 |
| 2016/0036355 A1* | 2/2016 | Moriya ............... H01L 21/6831 361/234 |
| 2017/0120287 A1* | 5/2017 | Park .................. H01L 21/67178 |
| 2018/0284071 A1* | 10/2018 | Wright ................. G01N 29/223 |

FOREIGN PATENT DOCUMENTS

| JP | 2003-037033 A | 2/2003 |
| JP | 2005-142566 A | 6/2005 |
| JP | 6139698 B2 | 5/2017 |

(Continued)

OTHER PUBLICATIONS

Office Action for Korean Application No. 10-2021-0083358 dated Jan. 17, 2023.

(Continued)

*Primary Examiner* — Steven H Whitesell
(74) *Attorney, Agent, or Firm* — Harness, Dickey & Pierce, P.L.C

(57) ABSTRACT

Provided is a support unit including a support plate on which the substrate is placed, and a support protrusion provided on the support plate and separating the substrate from the support plate, wherein the support plate includes a first protrusion protruding from an upper surface of the support plate, wherein the first protrusion is provided in a support region provided by the support protrusion.

18 Claims, 11 Drawing Sheets

(56) References Cited

FOREIGN PATENT DOCUMENTS

| JP | 2018-533763 A | 11/2018 |
|----|---------------|---------|
| JP | 2019-40983 A | 3/2019 |
| JP | 2021-73706 A | 5/2021 |
| KR | 10-2019-0053341 A | 5/2019 |
| WO | WO-2015/076369 A1 | 5/2015 |
| WO | WO-2020/120578 A1 | 6/2020 |

OTHER PUBLICATIONS

Office Action for Japanese Application No. 2022-102211 dated Jul. 18, 2023.

* cited by examiner

SUPPORT UNIT, BAKE APPARATUS AND SUBSTRATE TREATING APPARATUS INCLUDING THE SAME

CROSS-REFERENCE TO RELATED APPLICATIONS

This application claims priority to and the benefit of the Korean Patent Application No. 10-2021-0083358 filed in the Korean Intellectual Property Office on Jun. 25, 2021, the entire contents of which are incorporated herein by reference.

TECHNICAL FIELD

The present invention related to a support unit, and a bake apparatus and a substrate treating apparatus including the same.

BACKGROUND ART

In general, in order to manufacture semiconductor devices, various processes such as cleaning, deposition, photolithography, etching, and ion-implantation are performed. A photolithography process performed to form patterns plays an important role in achieving high integration of semiconductor devices.

The photolithography process is performed to form a photoresist pattern on a semiconductor substrate. The photolithography process includes a coating process of forming a photoresist film on a substrate, an exposure process of forming a photoresist pattern from the photoresist film, and a developing process of removing a region irradiated with light or an opposite region thereto in the exposure process, and a bake process of heating and cooling the substrate is performed before and after each process.

In the bake process, after the substrate is seated on a heating plate, the substrate is heated to a process temperature or higher. The bake process performed after forming the film on the substrate is performed by heating and volatilizing the photoresist film and the like applied on the substrate and controlling a film thickness to a set thickness. At this time, even after the heating of the substrate is completed and the substrate is removed from the heating plate, the substrate is continuously maintained in a hot state, so that a cooling control is required. Accordingly, in the baking process, the substrate removed from the heating plate is transferred to a cooling plate and then cooled.

FIG. 1 is a diagram schematically illustrating a conventional cooling unit. Referring to FIG. 1, a cooling unit 1 includes a cooling plate 2 and a support pin 3 provided on the cooling plate 2 to support a substrate W. The support pin 3 is provided to protrude upward from an upper surface of the cooling plate 2 so that an air gap is formed between a bottom surface of the substrate W and the upper surface of the cooling plate 2. In this case, the protrusion height of the support pin 3 is provided at a height at which a squeeze effect does not occur on the substrate.

However, there is a problem in that the cooling efficiency of the substrate is lowered by the air gap caused by the support pin 3.

SUMMARY OF THE INVENTION

The present invention has been made in an effort to provide a support unit, and a bake apparatus and a substrate treating apparatus including the same capable of increasing the cooling performance or heating performance of a substrate.

The problem to be solved by the present invention is not limited to the above-mentioned problems, and the problems not mentioned will be clearly understood by those skilled in the art from the present specification and the accompanying drawings.

An exemplary embodiment of the present invention provides a support unit for supporting a substrate.

The support unit includes a support plate on which the substrate is placed; and a support protrusion provided on the support plate and separating the substrate from the support plate, wherein the support plate includes a first protrusion protruding from an upper surface of the support plate and the first protrusion is provided in a support region provided by the support protrusion.

In the exemplary embodiment, the upper surface of the first protrusion may be provided flat.

In the exemplary embodiment, the support protrusion may be provided on the upper surface of the first protrusion.

In the exemplary embodiment, the first protrusion may be positioned adjacent to the support protrusion.

In the exemplary embodiment, the first protrusion may be provided to surround the support protrusion in a ring shape.

In the exemplary embodiment, the upper surface of the first protrusion may be positioned at a position lower than the upper surface of the support protrusion.

In the exemplary embodiment, the height of the first protrusion may be greater than the height of the support protrusion.

In the exemplary embodiment, the support plate may include a second protrusion protruding from the upper surface of the support plate and provided in a region other than the support region where the support protrusion is provided.

In the exemplary embodiment, the heights of the first protrusion and the second protrusion may be the same as each other.

In the exemplary embodiment, the second protrusion may be provided in an edge region of the support plate.

In the exemplary embodiment, the first protrusion includes a plurality of first protrusions, and the second protrusions may be provided between the plurality of first protrusions.

In the exemplary embodiment, a plurality of support protrusions may be provided, and the first protrusions may be provided in the number corresponding to the support protrusions.

In the exemplary embodiment, the support plate may include a notch formed in an edge region of the support plate, and the support plate may include a third protrusion protruding from the upper surface of the support plate and provided at a position adjacent to the notch.

In the exemplary embodiment, the support plate may include a slit-shaped guide groove extending inward from the edge of the support plate, and the support plate may include a fourth protrusion protruding from the upper surface of the support plate and provided at a position adjacent to the guide groove.

Another exemplary embodiment of the present invention provides a bake apparatus.

The bake apparatus includes a heating unit heating a substrate; a cooling unit cooling the substrate heated by the heating unit; a transfer unit transferring the substrate between the heating unit and the cooling unit; and a support unit provided to at least one of the heating unit, the cooling unit, and the transfer unit to support the substrate, wherein the support unit includes support plate on which the substrate is placed; a support protrusion provided on the support plate and separating the substrate from the support plate; and a protrusion protruding from an upper surface of the support plate, wherein the protrusion includes a first protrusion provided in a support region where the support protrusion is provided.

In the exemplary embodiment, an upper surface of the first protrusion may be provided flat, and the support protrusion may be provided on the upper surface of the first protrusion.

In the exemplary embodiment, the support protrusion may be provided on the upper surface of the support plate, and the first protrusion may be provided to surround the support protrusion in a ring shape.

Yet another exemplary embodiment of the present invention provides a substrate treating apparatus for treating a substrate.

The substrate treating apparatus includes a bake unit performing a heat treating process on the substrate; a liquid treating unit supplying a liquid to the substrate to perform a process; and a transfer robot transferring the substrate between the bake unit and the liquid treating unit, wherein the bake unit includes a housing; a heating unit positioned in the housing and heating the substrate; a cooling unit positioned in the housing and cooling the substrate heated by the heating unit; and a transfer unit positioned in the housing and transferring the substrate between the heating unit and the cooling unit, wherein the transfer unit includes a support plate on which the substrate is placed; and a first support protrusion provided on the support plate and separating the substrate from the support plate, wherein the support plate includes a first protrusion protruding from an upper surface of the support plate, wherein the first protrusion is provided in a support region where the first support protrusion is provided.

In the exemplary embodiment, the cooling unit may include a cooling plate for cooling the substrate; a cooling member provided inside the cooling plate; and second support protrusion provided on the cooling plate and separating the substrate from the cooling plate, wherein the cooling plate may include a second protrusion protruding upward from an upper surface of the cooling plate, wherein the second protrusion may be provided in a support region where the second support protrusion is provided.

In the exemplary embodiment, the first protrusion and the second protrusion may be provided with flat upper surfaces thereof, and the first support protrusion and the second support protrusion may be provided on the upper surface of the first protrusion and the upper surface of the second protrusion, respectively.

According to the exemplary embodiment of the present invention, it is possible to a support unit, and a bake apparatus and a substrate treating apparatus including the same capable of increasing the cooling performance or heating performance of a substrate.

The effect of the present invention is not limited to the foregoing effects, and non-mentioned effects will be clearly understood by those skilled in the art from the present specification and the accompanying drawings.

DETAILED DESCRIPTION

Figure 1:
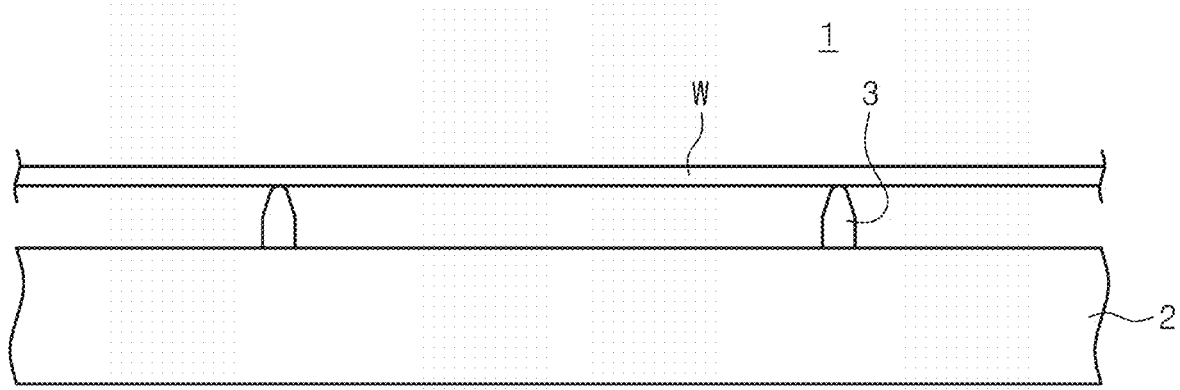
FIG. 1 is a diagram schematically illustrating a conventional cooling unit.

Hereinafter, an exemplary embodiment of the present invention will be described more fully hereinafter with reference to the accompanying drawings, in which exemplary embodiments of the invention are shown. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the term of "including" any component will be understood to imply the inclusion of stated elements but not the exclusion of any other elements. It will be appreciated that terms "including" and "having" are intended to designate the existence of characteristics, numbers, steps, operations, constituent elements, and components described in the specification or a combination thereof, and do not exclude a possibility of the existence or addition of one or more other characteristics, numbers, steps, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only for distinguishing one component from the other component. For example, without departing from the scope of the invention, a first constituent element may be named as a second constituent element, and similarly a second constituent element may be named as a first constituent element.

It should be understood that when one constituent element referred to as being "coupled to" or "connected to" another constituent element, one constituent element can be directly coupled to or connected to the other constituent element, but intervening elements may also be present. In contrast, when one constituent element is "directly coupled to" or "directly connected to" another constituent element, it should be understood that there are no intervening element present. Other expressions describing the relationship between the constituent elements, such as "between" and "just between" or "adjacent to ~", and "directly adjacent to ~" should be interpreted similarly.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

A controller may control a substrate treating apparatus. The controller may control components of a process chamber so as to treat the substrate according to a setting process as described above. The controller may include a processor controller consisting of a microprocessor (computer) executing a control of the substrate treating apparatus, a keyboard for performing a command input operation and the like to manage the substrate treating apparatus by an operator, a user interface consisting of a display and the like for visualizing and displaying an moving situation of the substrate treating apparatus, and a memory unit stored with control programs or various data for executing the treatment executed in the substrate treating apparatus by the control of the process controller and programs, that is, treatment recipes for executing the treatment in each configuration unit according to a treatment condition. In addition, the user interface and the memory unit may be connected to the process controller. The treatment recipes may be stored in a storage medium in the memory unit, and the storage medium may be a hard disk, and a transportable disk such as a CD-ROM, a DVD, and the like or a semiconductor memory such as a flash memory and the like.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

An apparatus of the exemplary embodiment may be used to perform a photolithography process on a substrate such as a semiconductor wafer or a flat panel display panel. In particular, the apparatus of the exemplary embodiment may be connected to an exposure apparatus and used to perform a coating process and a developing process on the substrate. Hereinafter, a case in which a wafer is used as the substrate will be described as an example.

Figure 2:
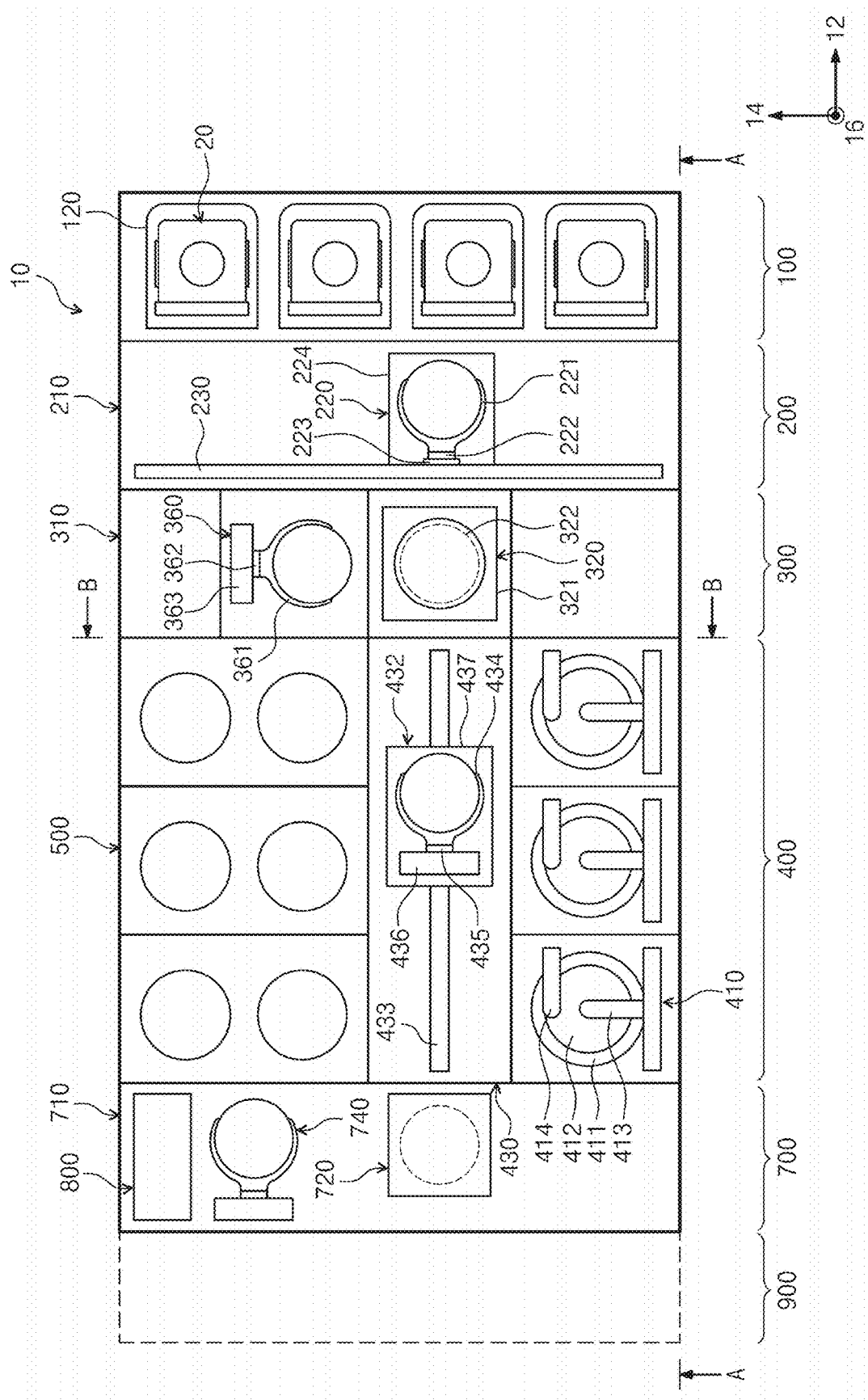
FIG. 2 is a diagram schematically illustrating a substrate treating apparatus according to an exemplary embodiment of the present invention.
Figure 3:
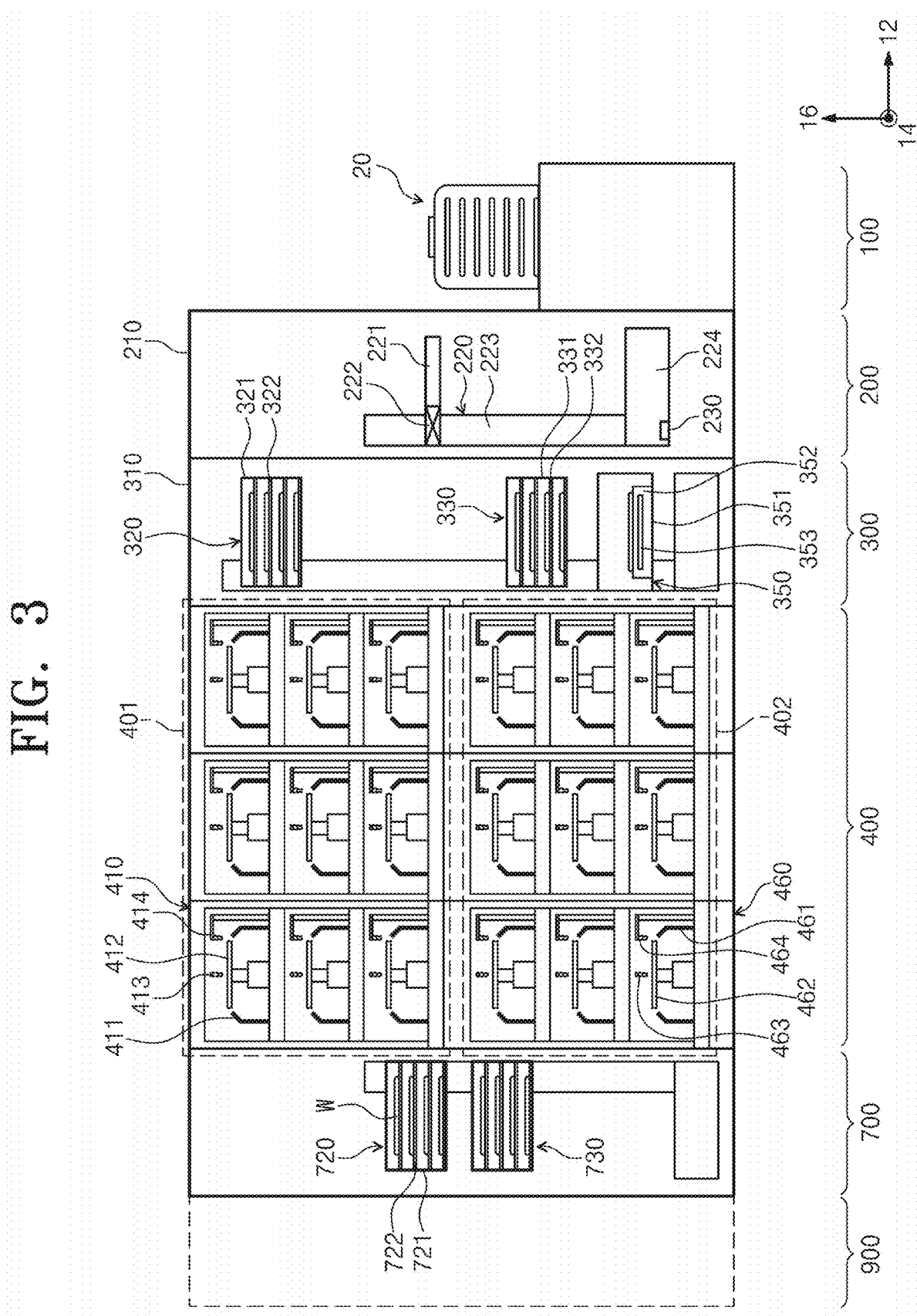
FIG. 3 is a diagram of the substrate treating apparatus of FIG. 2 when viewed from a A-A direction.
Figure 4:
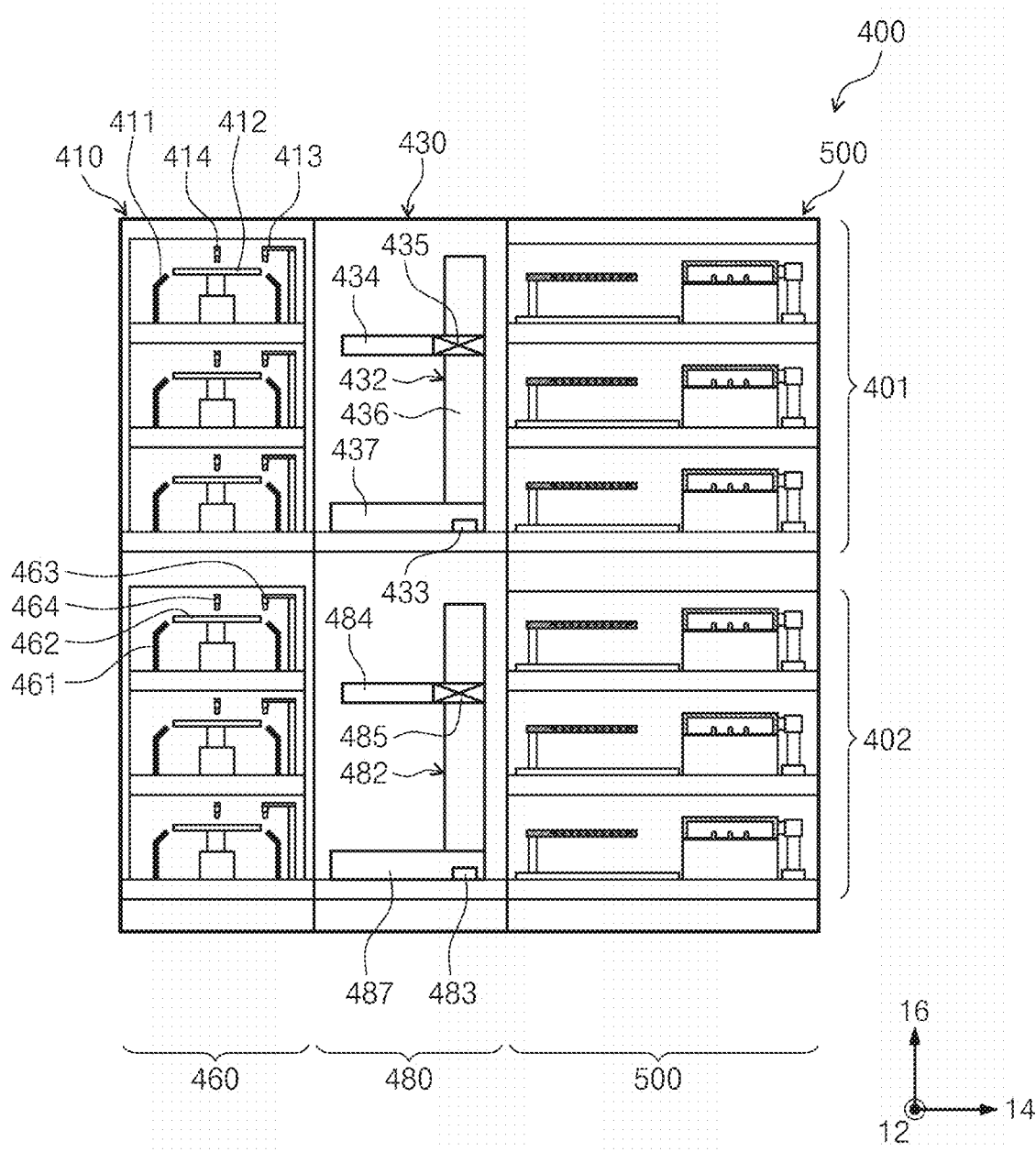
FIG. 4 is a diagram of the substrate treating apparatus of FIG. 2 when viewed from a B-B direction.

FIGS. 2 to 4 are diagrams schematically illustrating a substrate treating apparatus according to an exemplary embodiment of the present invention. FIG. 2 is a diagram schematically illustrating a substrate treating apparatus according to an exemplary embodiment of the present invention, FIG. 3 is a diagram of the substrate treating apparatus of FIG. 2 when viewed from a A-A direction, and FIG. 4 is a diagram of the substrate treating apparatus of FIG. 2 when viewed from a B-B direction.

Referring to FIGS. 2 to 4, a substrate treating apparatus 1 includes a load port 100, an index module 200, a buffer module 300, a coating and developing module 400, and an interface module 700, and a purge module 800. The load port 100, the index module 200, the buffer module 300, the coating and developing module 400, and the interface module 700 are sequentially disposed in a line in one direction. The purge module 800 may be provided in the interface module 700. Unlike this, the purge module 800 may be provided at various positions, such as a position to which an exposure apparatus at the rear end of the interface module 700 is connected, a side portion of the interface module 700, or the like.

Hereinafter, a direction in which the load port 100, the index module 200, the buffer module 300, the coating and developing module 400, and the interface module 700 are disposed is referred to as a first direction 12. When viewed from the top, a direction vertical to the first direction 12 is referred to as a second direction 14, and a direction vertical to each of the first direction 12 and the second direction 14 is referred to as a third direction 16.

A substrate W is moved while being received in a cassette 20. The cassette 20 has a structure that may be sealed from the outside. For example, as the cassette 20, a front open unified pod (FOUP) having a door at the front may be used.

Hereinafter, load port 100, the index module 200, the buffer module 300, the coating and developing module 400, the interface module 700, and the purge module 800 will be described.

The load port 100 has a mounting table 120 on which the cassette 20 in which the substrates W are received is placed. A plurality of mounting tables 120 are provided and the mounting tables 120 are disposed in a line along the second direction 14. In FIG. 2, it has been illustrated and described that four mounting tables 120 are provided, but the present invention is not limited thereto, and the mounting table may be provided in various numbers according to a footprint or necessity.

The index module 200 transfers the substrate W between the cassette 20 placed on the mounting table 120 of the load port 100 and the buffer module 300. The index module 200 includes a frame 210, an index robot 220, and a guide rail 230. The frame 210 is provided in a substantially hollow rectangular parallelepiped shape. The frame 210 is disposed between the load port 100 and the buffer module 300. The frame 210 of the index module 200 may be provided at a lower height than the frame 310 of the first buffer module 300 to be described below. The index robot 220 and the guide rail 230 are disposed in the frame 210. The index robot 220 has a 4-axis drivable structure so that a hand 221 for directly handling the substrate W may be movably rotated in the first direction 12, the second direction 14, and the third direction 16. The index robot 220 has a hand 221, an arm 222, a support 223, and a holder 224. The hand 221 is fixed to the arm 222. The arm 222 is provided in an extendible structure and a rotatable structure. The longitudinal direction of the support 223 is disposed along the third direction 16. The arm 222 is coupled to the support 223 to be movable along the support 223. The support 223 is fixedly coupled to the holder 224. The guide rail 230 is provided so that the longitudinal direction thereof is disposed along the second direction 14. The holder 224 is coupled to the guide rail 230 so as to be linearly movable along the guide rail 230. In addition, although not illustrated, the frame 210 is further provided with a door opener for opening and closing the door of the cassette 20.

The buffer module 300 includes a frame 310, a first buffer 320, a second buffer 330, a cooling chamber 350, and a first buffer robot 360. The frame 310 is provided in a hollow rectangular parallelepiped shape, and disposed between the index module 200 and the coating and developing module 400. The first buffer 320, the second buffer 330, the cooling chamber 350, and the first buffer robot 360 are positioned in the frame 310. The cooling chamber 350, the second buffer 330, and the first buffer 320 are disposed along the third direction 16 sequentially from the bottom. The first buffer 320 is positioned at a height corresponding to a coating module 401 of the coating and developing module 400 to be described below, and the second buffer 330 and the cooling chamber 350 are positioned at a height corresponding to a developing module 402 of the coating and developing module 400 to be described below. The first buffer robot 360 is spaced apart from the second buffer 330, the cooling chamber 350, and the first buffer 320 at a predetermined distance in the second direction 14.

The first buffer 320 and the second buffer 330 temporarily store the plurality of substrates W, respectively. The second buffer 330 has a housing 331 and a plurality of supports 332. The supports 332 are disposed in the housing 331 and are provided to be spaced apart from each other along the third direction 16. One substrate W is placed on each support 332. The housing 331 has openings (not illustrated) in a direction in which the index robot 220 is provided and a direction in which the first buffer robot 360 is provided, so that the index robot 220 and the first buffer robot 360 may carry in or out the substrate W to the support 332 in the housing 331. The first buffer 320 has a structure substantially similar to the second buffer 330. However, the housing 321 of the first buffer 320 has an opening in a direction in which the first buffer robot 360 is provided and in a direction in which a coating unit robot 432 positioned in the coating module 401 is provided. The number of supports 322 provided in the first buffer 320 and the number of supports 332 provided in the second buffer 330 may be the same as or different from each other. According to an exemplary embodiment, the number of supports 332 provided in the second buffer 330 may be greater than the number of supports 322 provided in the first buffer 320. The first buffer robot 360 transfers the substrate W between the first buffer 320 and the second buffer 330. The first buffer robot 360 has a hand 361, an arm 362, and a support 363. The hand 361 is fixed to the arm 362. The arm 362 is provided in an extendible structure, so that the hand 361 is movable along the second direction 14. The arm 362 is coupled to the support 363 to be linearly movable along the support 363 in the third direction 16. The support 363 has a length extending from a position corresponding to the second buffer 330 to a position corresponding to the first buffer 320. The support 363 may be provided longer upward or downward than the length. The first buffer robot 360 may be provided so that the hand 361 is only biaxially driven along the second direction 14 and the third direction 16.

The cooling chamber 350 cools the substrate W. The cooling chamber 350 has a housing 351 and a cooling plate 352. The cooling plate 352 has an upper surface on which the substrate W is placed and a cooling means 353 for cooling the substrate W. As the cooling means 353, various methods such as cooling by a coolant, cooling using a thermoelectric element, and the like may be used. In addition, a lift pin assembly (not illustrated) for positioning the substrate W on the cooling plate 352 may be provided in the cooling chamber 350. The housing 351 has openings in a direction in which the index robot 220 is provided and a direction in which a developing unit robot is provided, so that the index robot 220 and the developing unit robot provided in the developing module 402 may carry in or out the substrate W from or to the cooling plate 352. In addition, doors for opening and closing the above-described openings may be provided in the cooling chamber 350.

The coating module 401 includes a process of coating a photosensitive liquid such as a photoresist on the substrate W and a heat-treating process such as heating and cooling the substrate W before and after the resist coating process. The coating module 401 has a liquid treating chamber 410, a bake unit 500, and a transfer chamber 430. The liquid treating chamber 410, the bake unit 500, and the transfer chamber 430 are disposed sequentially along the second direction 14. The liquid treating chamber 410 may be provided as a resist coating chamber 410 for performing the resist coating process on the substrate W. A plurality of resist coating chambers 410 are provided, and a plurality of resist coating chambers are provided in the first direction 12 and the third direction 16, respectively. A plurality of bake units 500 are provided in the first direction 12 and the third direction 16, respectively.

The transfer chamber 430 is positioned in parallel with the first buffer 320 of the first buffer module 300 in the first direction 12. A coating unit robot 432 and a guide rail 433 are positioned in the transfer chamber 430. The transfer chamber 430 has a substantially rectangular shape. The coating unit robot 432 transfers the substrate W between the bake units 420, the resist application chambers 410, and the first buffer 320 of the first buffer module 300. The guide rail 433 is disposed so that the longitudinal direction thereof is in parallel with the first direction 12. The guide rail 433 guides the coating unit robot 432 to move linearly in the first direction 12.

The coating unit robot 432 has a hand 434, an arm 435, a support 436, and a holder 437. The hand 434 is fixed to the arm 435. The arm 435 is provided in an extendible structure so that the hand 434 is movable in a horizontal direction. The support 436 is provided so that the longitudinal direction thereof is disposed along the third direction 16. The arm 435 is coupled to the support 436 to be linearly movable along the support 436 in the third direction 16. The support 436 is fixedly coupled to the holder 437, and the holder 437 is coupled to the guide rail 433 to be movable along the guide rail 433.

Figure 5:
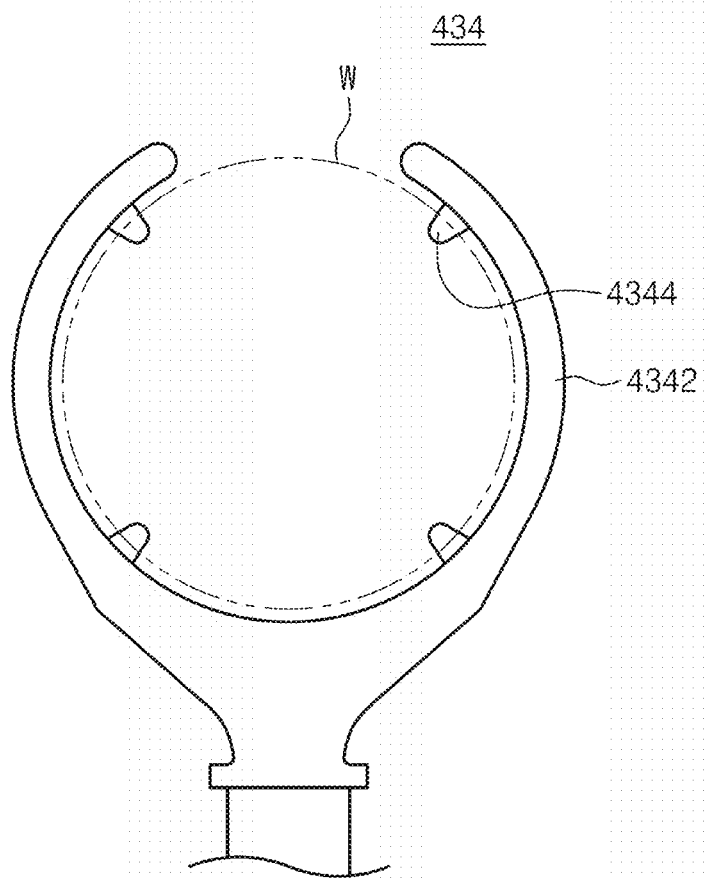
FIG. 5 is a diagram illustrating an example of A hand of an application unit robot of FIG. 2.

FIG. 5 is a diagram illustrating an example of the hand of the coating unit robot. Referring to FIG. 5, the hand 434 includes a base 4342 and protrusions 4344. The base 4342 may have an annular ring shape of which a part of the circumference is bent. The base 4342 has an inner diameter greater than the diameter of the substrate W. The protrusion 4344 extends to the inner side thereof from the base 4342. A plurality of protrusions 4344 may be provided. According to the exemplary embodiment, four protrusions 4344 may be provided at equal intervals. The protrusions 4344 support an edge region of the substrate W.

The resist coating chambers 410 all have the same structure. However, types of photoresists used in the respective resist coating chambers 410 may be different from each other. As an example, a chemical amplification resist may be used as the photoresist. The resist coating chamber 410 coats a photoresist on the substrate W. The resist coating chamber 410 has a housing 411, a support plate 412, and a nozzle 413.

The housing 411 has a cup shape with an opened upper portion. The support plate 412 is positioned in the housing 411 and supports the substrate W. The support plate 412 is provided rotatably. The nozzle 413 supplies the photoresist onto the substrate W placed on the support plate 412. The nozzle 413 has a circular pipe shape, and may supply the photoresist to the center of the substrate W. Optionally, the nozzle 413 may have a length corresponding to the diameter of the substrate W, and an ejection hole of the nozzle 413 may be provided as a slit. In addition, the resist coating chamber 410 may further include a nozzle 414 for supplying a cleaning liquid such as deionized water in order to clean the surface of the substrate W on which the photoresist is coated.

Referring to FIGS. 2 to 4, the developing module 402 includes a developing process for removing some of the photoresist by supplying a developer to obtain patterns on the substrate W, and a heat-treating process such as heating and cooling performed on the substrate W before and after the developing process. The developing module 402 includes a liquid treating chamber 460, a bake unit 500, and a transfer chamber 480. The liquid treating chamber 460, the bake unit 500, and the transfer chamber 480 are disposed sequentially along the second direction 14. The liquid treating chamber 460 may be provided as a developing chamber. The developing chamber 460 and the bake chamber 500 are spaced apart from each other in the second direction 14 with the transfer chamber 480 interposed therebetween. A plurality of developing chambers 460 are provided, and the plurality of developing chambers 460 are provided in the first direction 12 and the third direction 16, respectively.

The transfer chamber 480 is positioned in parallel with the second buffer 330 of the first buffer module 300 in the first direction 12. A developing unit robot 482 and a guide rail 483 are positioned in the transfer chamber 480. The transfer chamber 480 has a substantially rectangular shape. The developing unit robot 482 transfers the substrate W among the bake units 470, the developing chambers 460, and the second buffer 330 and the cooling chamber 350 of the first buffer module 300. The guide rail 483 is disposed so that the longitudinal direction thereof is in parallel with the first direction 12. The guide rail 483 guides the developing unit robot 482 to move linearly in the first direction 12. The developing unit robot 482 has a hand 484, an arm 485, a support 486, and a holder 487. The hand 484 is fixed to the arm 485. The arm 485 is provided in an extendible structure so that the hand 484 is movable in a horizontal direction. The support 486 is provided so that the longitudinal direction thereof is disposed along the third direction 16. The arm 485 is coupled to the support 486 to be linearly movable along the support 486 in the third direction 16. The support 486 is fixedly coupled to the holder 487. The holder 487 is coupled to the guide rail 483 so as to be movable along the guide rail 483.

The developing chambers 460 all have the same structure. However, types of developers used in each developing chamber 460 may be different from each other. The developing chamber 460 removes a region irradiated with light from the photoresist on the substrate W. At this time, a region irradiated with light of a protective film is removed together. Only a region to which the light is not irradiated among regions of the photoresist and the protective film may be removed according to a type of selectively used photoresist.

The developing chamber 460 has a housing 461, a support plate 462, and a nozzle 463. The housing 461 has a cup shape with an opened upper portion. The support plate 462 is positioned in the housing 461 and supports the substrate W. The support plate 462 is provided rotatably. The nozzle 463 supplies a developer onto the substrate W placed on the support plate 462. The nozzle 463 has a circular pipe shape, and may supply the developer to the center of the substrate W. Optionally, the nozzle 463 may have a length corresponding to the diameter of the substrate W, and an ejection hole of the nozzle 463 may be provided as a slit. In addition, the developing chamber 460 may further include a nozzle 464 for supplying a cleaning liquid such as deionized water to clean the surface of the substrate W to which the developer is additionally supplied.

As described above, in the coating and developing module 400, the coating module 401 and the developing module 402 are provided to be separated from each other. In addition, when viewed from the top, the coating module 401 and the developing module 402 may have the same chamber disposition.

The interface module 700 transfers the substrate W. The interface module 700 has a frame 710, a first buffer 720, a second chamber 730, and an interface robot 740. The first buffer 720, the second chamber 730, and the interface robot 740 are positioned in the frame 710. The first buffer 720 and the second buffer 730 are spaced apart from each other by a predetermined distance and are disposed to be stacked on each other. The first buffer 720 is disposed higher than the second buffer 730.

The interface robot 740 is positioned to be spaced apart from the first buffer 720 and the second buffer 730 in the second direction 14. The interface robot 740 transfers the substrate W among the first buffer 720, the second buffer 730, and the exposure apparatus 900.

The first buffer 720 temporarily stores the substrates W, which the processes are performed, before the substrates W are moved to the exposure apparatus 900. In addition, the second buffer 730 temporarily stores the substrates W, before the substrates W, in which the process is completed in the exposure apparatus 900, are moved. The first buffer 720 has a housing 721 and a plurality of supports 722. The supports 722 are disposed in the housing 721 and are provided to be spaced apart from each other along the third direction 16. One substrate W is placed on each support 722. The housing 721 has openings in a direction in which the interface robot 740 is provided and a direction in which a pre-treating robot 632 is provided, so that the interface robot 740 and the pre-treating robot 632 may carry in or out the substrate W from or to the support 722 in the housing 721. The second buffer 730 has a structure similar to the first buffer 720. As described above, only the buffers and the robot may be provided in the interface module without providing a chamber for performing a predetermined process on the substrate W.

Figure 6:
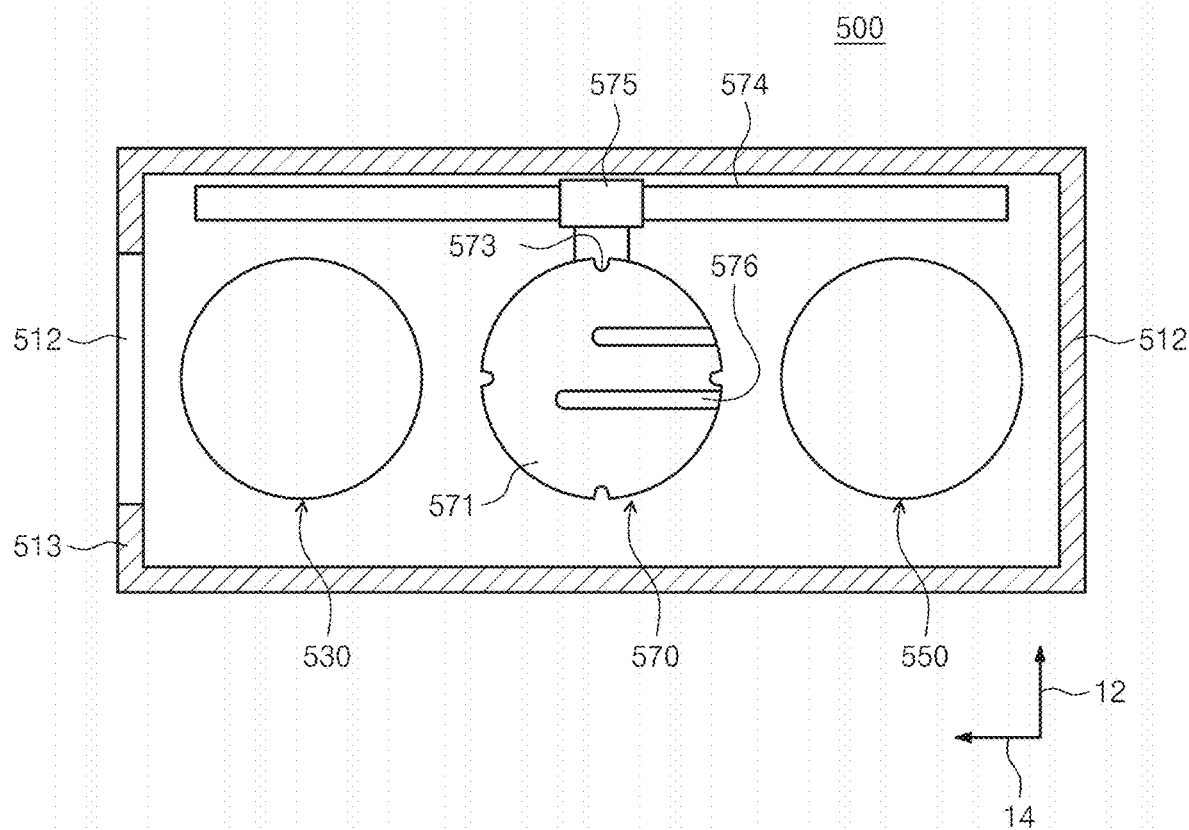
FIG. 6 is a plan view of a bake unit according to an exemplary embodiment of the present invention.
Figure 7:
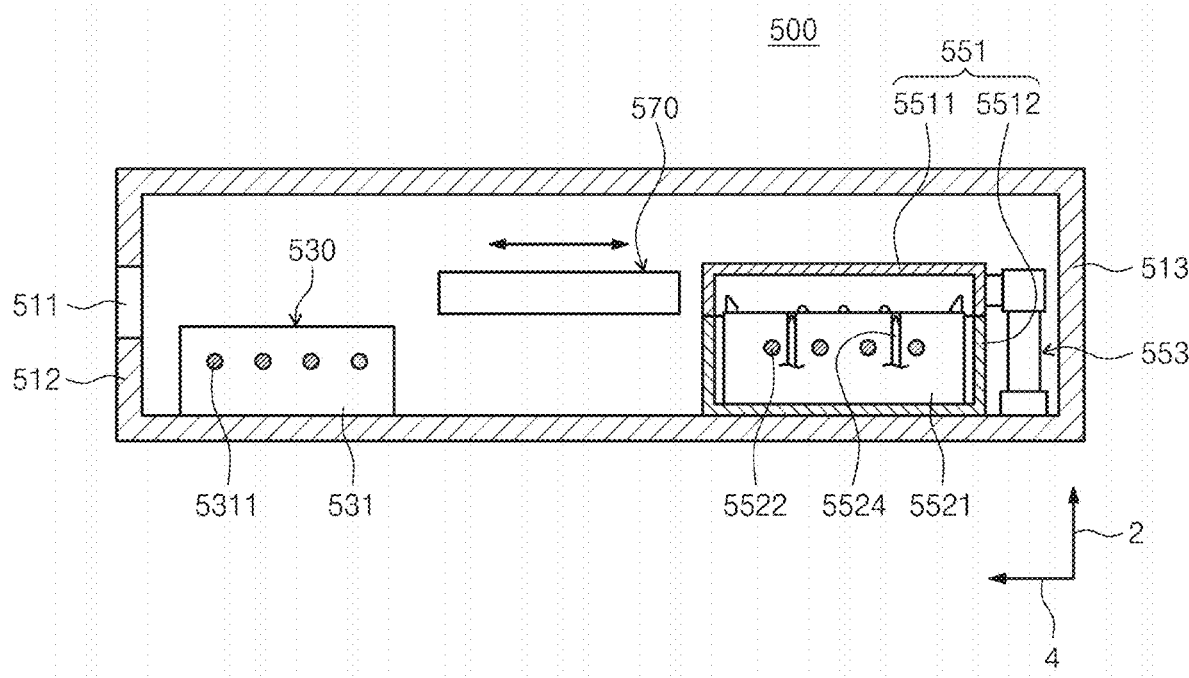
FIG. 7 is a cross-sectional view of the bake unit of FIG. 6.

FIGS. 6 and 7 are diagrams illustrating the bake apparatus.

Referring to FIGS. 6 and 7, the bake apparatus 500 heat-treats the substrate W. For example, the bake apparatuses 500 perform a heating process such as a prebake process of heating the substrate W at a predetermined temperature before coating the photoresist to remove organic materials or moisture from the surface of the substrate W, a soft bake process performed after coating the photoresist on the substrate W, or the like, and perform a cooling process of cooling the substrate W after each heating process, and the like.

The bake apparatus 500 may include a housing 510, a cooling unit 530, a heating unit 550, and a transfer unit 570.

The housing 510 provides a space in which the baking process is performed. The housing 510 is provided in a rectangular parallelepiped shape. The housing 510 includes a first side wall 511, a second side wall 513, and an entrance 512. The first side wall 511 is provided on one side surface of the housing 510. The second side wall 513 is provided opposite to the first side wall 511. On the side wall of the housing 510, the entrance 512 through which the substrate W is carried in or out is formed. For example, the entrance 512 may be formed on the first side wall 511. The entrance 512 provides a passage through which the substrate W moves. The entrance 512 may be maintained in an opened state. Optionally, a door (not illustrated) may be provided to open and close the entrance 512. The cooling unit 530, the heating unit 550, and the transfer unit 570 are provided in the housing 510. The cooling unit 530 and the heating unit 550 are provided in parallel along the second direction 14. According to the exemplary embodiment, the cooling unit 530 may be positioned closer to the transfer chamber 430 than the heating unit 550.

The cooling unit 530 cools the heat-treated substrate W. The cooling unit 530 includes a support unit. The support unit supports the substrate W in the housing 510. The support unit includes a support plate 531 and a support protrusion 532 provided on the support plate 531. The substrate W is placed on the support plate 531. The support plate 531 supports the substrate W. The support plate 531 is provided with the same size as the substrate W. The support plate 531 may have a circular shape, when viewed from the top. A cooling member 5311 is provided in the support plate 531. According to the exemplary embodiment, the cooling member 5311 is formed inside the support plate 531, and may be provided as a flow channel in which a cooling fluid flows. The support plate 531 is provided with a metal material having good thermal conductivity. For example, the support plate 531 may be provided with an aluminum (Al) material or an Al-anodizing material. However, the present invention is not limited thereto, and the support plate 531 may be provided with a material that facilitates heat transfer. The support plate 531 and the cooling member 5311 may serve as a cooling plate for cooling the substrate W. That is, the support plate 531 cools the substrate W supported by the support plate 531. A support protrusion 532 is provided in the support plate 531. A plurality of support protrusions 532 may be provided. The plurality of support protrusions 532 are provided on the support plate 531 to be spaced apart from each other. The support protrusions 532 separate the substrate W from the support plate 531. The support protrusions 532 are in contact with a bottom surface of the substrate W to support the substrate W. An air gap is formed between the substrate W and the support plate 531 by the support protrusions 532.

Figure 8:
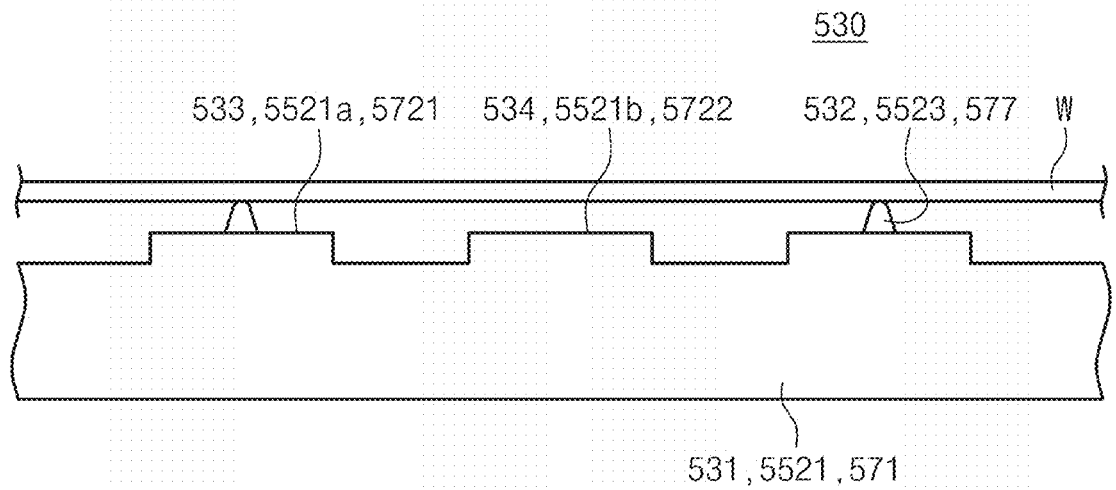
FIG. 8 is a diagram schematically illustrating a support unit according to an exemplary embodiment of the present invention.
Figure 9:
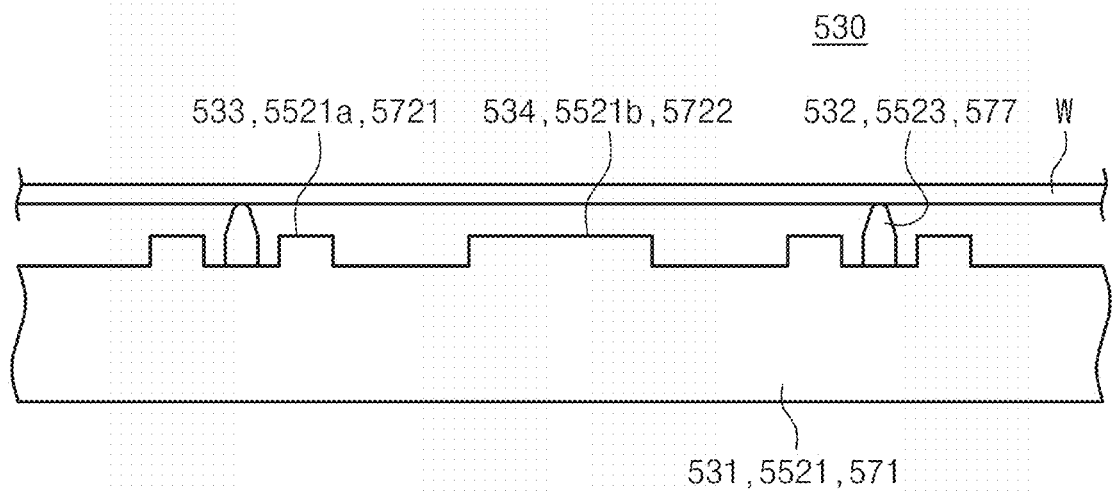
FIG. 9 is a diagram schematically illustrating a support unit according to another exemplary embodiment of the present invention.

FIG. 8 is a diagram schematically illustrating a support unit according to an exemplary embodiment of the present invention. FIG. 9 is a diagram schematically illustrating a support unit according to another exemplary embodiment of the present invention. Referring to FIGS. 8 and 9, the support plate 531 includes a protrusion. The protrusion protrudes from an upper surface of the support plate 531. The protrusion protrudes toward the substrate W supported by the support plate 531. The protrusion protrudes in a direction to reduce the air gap between the substrate W and the support plate 531. The protrusion is provided with the same material as the support plate 531. For example, the support plate 531 and the protrusion may be provided with aluminum (Al) or anodized-Al. However, the present invention is not limited thereto, and the protrusion and the support plate 531 may be formed of a material that facilitates heat transfer. In addition, the support plate 531 and the protrusion may be provided with different materials. The upper surface of the support plate 531 and the substrate W are spaced apart from each other at a first spacing distance. The protrusion and the substrate W are spaced apart from each other at a second spacing distance smaller than the first spacing distance.

The protrusion includes a first protrusion 533. The first protrusion 533 is provided in a support region where the support protrusion 532 is provided. The first protrusion 533 is provided on the periphery of the support protrusion 532. According to an exemplary embodiment of the present invention, the upper surface of the first protrusion 533 is provided flat, and the support protrusion 532 is provided on the upper surface of the first protrusion 533 (see FIG. 8). In this case, the height of the first protrusion 533 may be greater than the height of the support protrusion 532. For example, when the spacing distance between the bottom surface of the substrate W and the upper surface of the support plate 531 is 150 μm, the height of the first protrusion 533 may be 100 μm and the height of the support protrusion 532 may be 50 μm. In this case, the distance between the substrate W and the first protrusion 533 is reduced, thereby increasing the cooling efficiency even while minimizing a squeeze effect.

According to another exemplary embodiment of the present invention, the first protrusion 533 is provided at a position adjacent to the support protrusion 532. Referring to FIG. 9, the first protrusion 533 is provided to surround the support protrusion 532 in a ring shape. When viewed from the top, the first protrusion 533 is provided in a ring shape. The first protrusion 533 includes a groove formed on the upper surface of the first protrusion 533 and the support protrusion 532 is provided in the groove. The upper surface of the first protrusion 533 is positioned at a lower position than the upper surface of the support protrusion 532.

A plurality of first protrusions 533 is provided. The plurality of first protrusions 533 is provided with the number corresponding to the number of support protrusions 532.

The protrusion includes a second protrusion 534. The second protrusion 534 protrudes form the upper surface of the support plate 531. The second protrusion 534 is provided in a region other than the support region where the support protrusion 532 is provided. The second protrusion 534 is provided at the same height as the first protrusion 533. A plurality of second protrusions 534 may be provided. The second protrusion 534 is provided at a position to avoid a contact with the substrate W according to a warpage of the substrate W seated on the support plate 531. For example, the providing position of the second protrusion 534 may be provided at a position that is not in contact with the second protrusion 534 due to a tensile warpage of the substrate W. In addition, the providing position of the second protrusion 534 may be provided at a position that is not in contact with the second protrusion 534 due to a compressive warpage of the substrate W. In addition, the second protrusion 534 may be provided at a position that is not in contact with the second protrusion 534 due to the tensile and compressive warpages of the substrate W. For example, when the substrate W is convexly warped downward, the second protrusion 534 may be provided in an edge region of the support plate 531. The second protrusion 534 may be provided between the plurality of first protrusions 533, and even at this time, the second protrusion 534 may be provided at a position which is not in contact with the substrate W according to the warpage of the substrate W.

When viewed from the top, the area of the first protrusion 533 may be different from that of the second protrusion 534. For example, the area of the second protrusion 534 may be larger than that of the first protrusion 533. However, the present invention is not limited thereto, and the area of the second protrusion 534 may be smaller than that of the first protrusion 533, or the areas of the first and second protrusions 533 and 534 may have the same area as each other. The first protrusion 533 and the second protrusion 534 may be provided in different shapes. However, the present invention is not limited thereto, and the first protrusion 533 and the second protrusion 534 may be provided in various shapes depending on a position at which each protrusion is provided.

A spacing distance d3 between the first protrusion 533 and the substrate W is smaller than a spacing distance d1 between the upper surface of the support plate 531 and the substrate W. A spacing distance d3 between the second protrusion 534 and the substrate W is smaller than the spacing distance d1 between the upper surface of the support plate 531 and the substrate W. At this time, the spacing distance d3 between the first protrusion 533 and the substrate W may be the same as the spacing distance d3 between the second protrusion 534 and the substrate W. That is, a height d2 of the first protrusion 533 is provided to be the same as a height d4 of the second protrusion 534.

Referring back to FIG. 1, the protruding height of the support pin 3 is provided at a height at which a squeeze effect does not occur on the substrate W. For example, the protrusion height of the support pin 3 may be about 150 μm. In this case, the heat transfer from the cooling plate 2 to the substrate W is not facilitated due to the spacing distance between the substrate W and the cooling plate 2, so that the cooling performance of the substrate W is reduced. When the height of the support pins 3 is formed to be lower than 150 μm in order to improve the cooling performance, the substrate W is damaged due to the squeeze effect.

However, according to an exemplary embodiment of the present invention, the protrusion for reducing the air gap between the substrate W and the support plate 531 is provided, thereby increasing the cooling efficiency for cooling the substrate W by the support plate 531. In addition, the protrusion is provided at the periphery of the support protrusion 532, thereby preventing a contact issue due to the warpage of the substrate W.

Referring back to FIGS. 6 and 7, the heating unit 550 heats the substrate W at a set temperature. The heating unit 550 is provided as a device for heating the substrate W to a temperature higher than room temperature. The heating unit 550 heat-treats the substrate W in normal pressure or a reduced pressure atmosphere lower there than. The heating unit 550 may perform a bake process on the substrate W. The heating unit 550 may supply gas while heating the substrate W to improve the adhesion rate of the photoresist to the substrate W. According to an exemplary embodiment, the gas may be hexamethyldisilane gas. The heating unit 550 may include a chamber 551, a support unit 552, an exhaust unit (not illustrated), a gas supply unit (not illustrated), and an elevation unit.

The chamber 551 may include an upper chamber 5511, a lower chamber 5512, and a sealing member (not illustrated). The upper chamber 5511 may have a cylindrical shape with an opened lower portion. The lower chamber 5512 may have a cylindrical shape with an opened upper portion. The lower chamber 5512 may be disposed below the upper chamber 5511. The upper chamber 5511 and the lower chamber 5512 may be combined with each other to have an inner space. In addition, a sealing member may be provided between the upper chamber 5511 and the lower chamber 5512. The sealing member is positioned between the upper chamber 5511 and the lower chamber 5512. The sealing member allows the inner space to be sealed from the outside when the upper chamber 5511 and the lower chamber 5512 come into contact with each other. The sealing member may be provided in an annular ring shape. The sealing member may be fixedly coupled to an upper end of the lower chamber 5512.

The heating unit 550 includes a support unit 552. The support unit 552 supports the substrate W in the inner space of the chamber 551. In addition, the support unit 552 may heat the substrate W. The support unit 552 includes a support plate 5521, a support protrusion 5523, a lift pin 5524, and a guide 5525.

The support plate 5521 is provided in a circular plate shape. An upper surface of the support plate 5521 may have a diameter greater than that of the substrate W. The upper surface of the support plate 5521 may function as a seating surface on which the substrate W is placed. In addition, a heater 5522 may be provided on the support plate 5521. The heater 5522 may heat the substrate W. In addition, a plurality of heaters 5522 may be provided. The plurality of heaters 5522 may heat the substrate W at a different temperature for each region. For example, some of the plurality of heaters 5522 may heat a central region of the substrate W at a first temperature, and some of the plurality of heaters 5522 may heat middle and edge regions of the substrate W at a second temperature. The first temperature and the second temperature may be different from each other.

The support protrusion 5523 is provided on the support plate 5521. The support protrusion 5523 may support the bottom surface of the substrate W. The support protrusion 5523 may prevent the substrate W from being in direct contact with the support plate 5521. The support protrusion 5523 separates the substrate W from the support plate 5521.

The support plate 5521 includes a protrusion. The structure of the protrusion and the support plate 5521 of the heating unit 550 may have a similar structure to the support plate 531 and the support protrusion 532 of the cooling unit 530. Accordingly, a description related to the support plate 531 of the cooling unit 530 and the protrusion of the support protrusion 532 may be analogously applied.

The protrusion protrudes from an upper surface of the support plate 5521. The protrusion protrudes toward the substrate W supported by the support plate 5521. The protrusion protrudes in a direction to reduce the air gap between the substrate W and the support plate 5521. The protrusion is provided with the same material as the support plate 5521. The protrusion and the support plate 5521 may be formed of a material that facilitates heat transfer. In addition, the support plate 5521 and the protrusion may be provided with different materials.

The protrusion includes a first protrusion 5521a. The first protrusion 5521a is provided in a support region where the support protrusion 5523 is provided. The first protrusion 5521a is provided on the periphery of the support protrusion 5523. According to an exemplary embodiment of the present invention, the upper surface of the first protrusion 5521a is provided flat, and the support protrusion 5523 is provided on the upper surface of the first protrusion 5521a (see FIG. 8). According to another exemplary embodiment of the present invention, the first protrusion 5521a is provided at a position adjacent to the support protrusion 5523. Referring to FIG. 9, the first protrusion 5521a is provided to surround the support protrusion 5523 in a ring shape. The upper surface of the first protrusion 5521a is positioned at a lower position than the upper surface of the support protrusion 5523. A plurality of first protrusions 5521a is provided. The plurality of first protrusions 5521a is provided with the number corresponding to the number of support protrusions 5523. The first protrusion 5521a is disposed in the support region where the support protrusion 5523 is provided, thereby increasing the heating efficiency of the substrate W.

The protrusion includes a second protrusion 5521b. The second protrusion 5521b protrudes form the upper surface of the support plate 5521. The second protrusion 5521b is provided in a region other than the support region where the support protrusion 5523 is provided. The second protrusion 5521b is provided at the same height as the first protrusion 5521a. A plurality of second protrusions 5521b may be provided. The second protrusion 5521b is provided at a position capable of avoiding a contact with the substrate W according to a warpage of the substrate W seated on the support plate 5523. A spacing distance between the first protrusion 5521a and the substrate W and a spacing distance between the second protrusion 5521b and the substrate W are smaller than a spacing distance between the upper surface of the support plate 5521 and the substrate W. Accordingly, the heating efficiency of the substrate W may be increased.

The lift pin 5524 may move the substrate W in a vertical direction. A plurality of lift pins 5524 may be provided. The lift pins 5524 may move the substrate W in the vertical direction when the substrate W is carried in or out from the inner space.

The guide 5525 guides the substrate W so that the substrate W is placed in a fixed position on the seating surface. The guide 5525 is provided to have an annular ring shape surrounding the seating surface. The guide 5525 has a diameter greater than the substrate W. The inner surface of the guide 5525 has a downwardly inclined shape toward the central axis of the support plate 5521. Accordingly, the substrate W through the inner surface of the guide 5525 is moved to the fixed position over the inclined surface thereof. In addition, the guide 5525 may prevent a small amount of airflow flowing between the substrate W and the seating surface.

The heating unit 550 includes an elevation unit 553. The elevation unit 553 may move any one of the upper chamber 5511 and the lower chamber 5512. For example, the elevation unit 553 may move the upper chamber 5511 in the vertical direction. The elevation unit 553 may move the upper chamber 5511 to an open position or a closed position. The open position is a position in which the upper chamber 5511 and the lower chamber 5512 are spaced apart from each other so that the inner space is opened. The closed position is a position where the inner space is sealed from the outside by the upper chamber 5511 and the lower chamber 5512.

The transfer unit 570 is provided in the housing 510. The transfer unit 570 transfers the substrate W between the heating unit 550 and the cooling unit 530. The transfer unit 570 includes a transfer plate 571. The transfer plate 571 supports the substrate W when the substrate W is transferred. The transfer plate 571 may be referred to as the support plate 571.

The transfer plate 571 is provided in a substantially disk shape and has a diameter corresponding to the substrate W. A notch 573 is formed at the edge of the transfer plate 571. The notch 573 may have a shape corresponding to a protrusion 4344 formed on the hand 434 of the coating unit robot 432 described above. Further, the notch 573 is provided as the number corresponding to the protrusion 4344 formed on the hand 434 and is formed at a position corresponding to the protrusion 4344. When the top and bottom positions of the hand 434 and the transfer plate 571 are changed at a position where the hand 434 and the transfer plate 571 are aligned in the vertical direction, the substrate W is transferred between the hand 434 and the transfer plate 571. The transfer plate 571 is mounted on the guide rail 574 and may be moved along the guide rail 574 by a driver 575. The transfer plate 571 is provided with a plurality of slit-shaped guide grooves 576. The guide groove 576 extends to the inside of the transfer plate 571 from the end of the transfer plate 571. The longitudinal direction of the guide groove 576 is provided along the second direction 14, and the guide grooves 576 are positioned to be spaced apart from each other along the first direction 12. The guide grooves 576 prevents the transfer plate 571 and the lift pin 5524 from interfering with each other when the substrate W is transferred between the transfer plate 571 and the heating unit 550.

A support protrusion 577 is provided in the transfer plate 571. The support protrusion 577 is provided to the transfer plate 571. The support protrusion 577 may support the bottom surface of the substrate W. The support protrusion 577 may prevent the substrate W from being in direct contact with the transfer plate 571. The support protrusion 557 separates the substrate W from the transfer plate 571.

Figure 10:
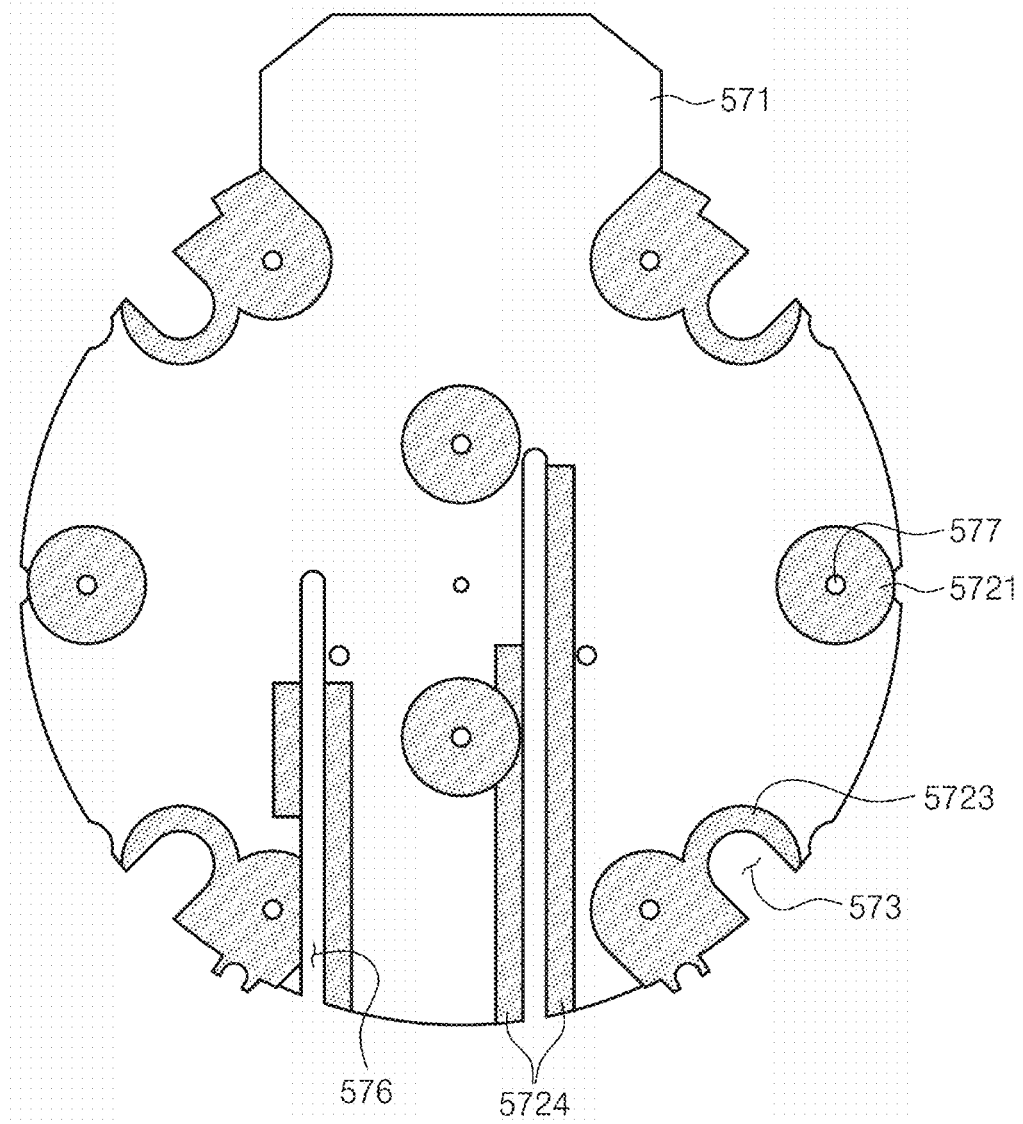
FIGS. 10 and 11 are plan views schematically illustrating protrusions applied to a transfer plate of a transfer unit according to an exemplary embodiment of the present invention.
Figure 11:
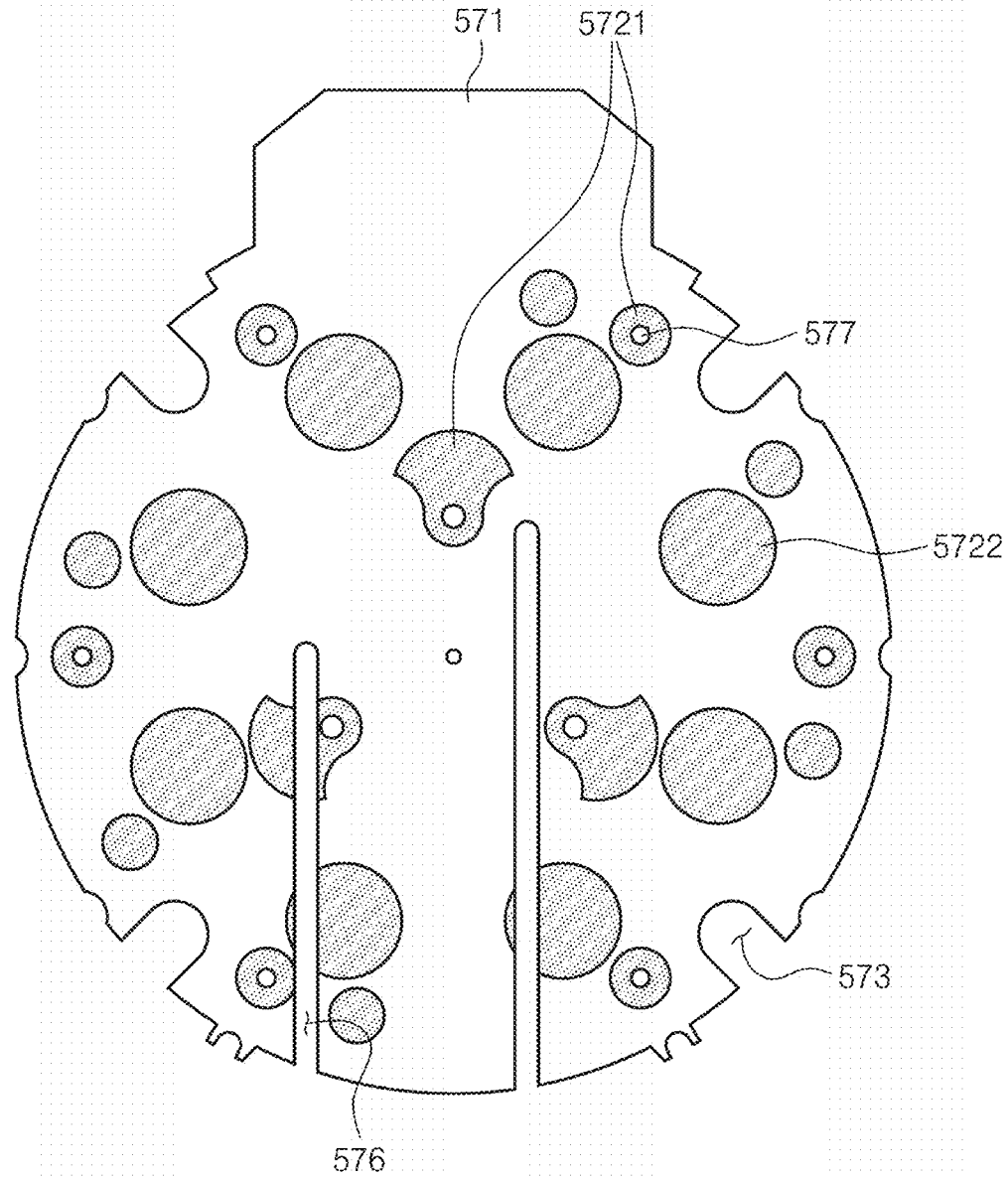

FIGS. 10 and 11 are plan views schematically illustrating protrusions applied to a transfer plate of a transfer unit according to an exemplary embodiment of the present invention.

Referring to FIGS. 10 and 11, the transfer plate 571 includes a protrusion 572. The structure of the protrusion 572 and the transfer plate 571 of the transfer unit 570 may have a similar structure to the support plate 531 of the cooling unit 530 and the protrusion of the support protrusion 532. Accordingly, a description related to the support plate 531 of the cooling unit 530 and the protrusion of the support protrusion 532 may be analogously applied.

The protrusion 572 includes a first protrusion 5721. Like the first protrusion 533 of the cooling unit 530, the first protrusion 5721 may be provided in a support region in which the support protrusion 577 is provided. The protrusion 572 includes a second protrusion 5722. Like the second protrusion 534 of the cooling unit 530, the second protrusion 5722 may be provided in a region other than the support region in which the support protrusion 577 is provided. The second protrusion 5722 may be provided at a position where a contact issue with the substrate W does not occur according to the warpage of the substrate W.

The protrusion 572 includes a third protrusion 5723. The second protrusion 5723 protrudes from the upper surface of the transfer plate 571 and is provided at a position adjacent to the notch 573. The third protrusion 5723 is provided at the edge of the notch 573. The protrusion 572 includes a fourth protrusion 5724. The fourth protrusion 5724 protrudes from the upper surface of the transfer plate 571 and is provided at a position adjacent to the guide groove 576. The fourth protrusion 5724 is provided to have a shape corresponding to the slit shape of the guide groove 576 and is provided at the edge of the guide groove 576.

Figure 12:
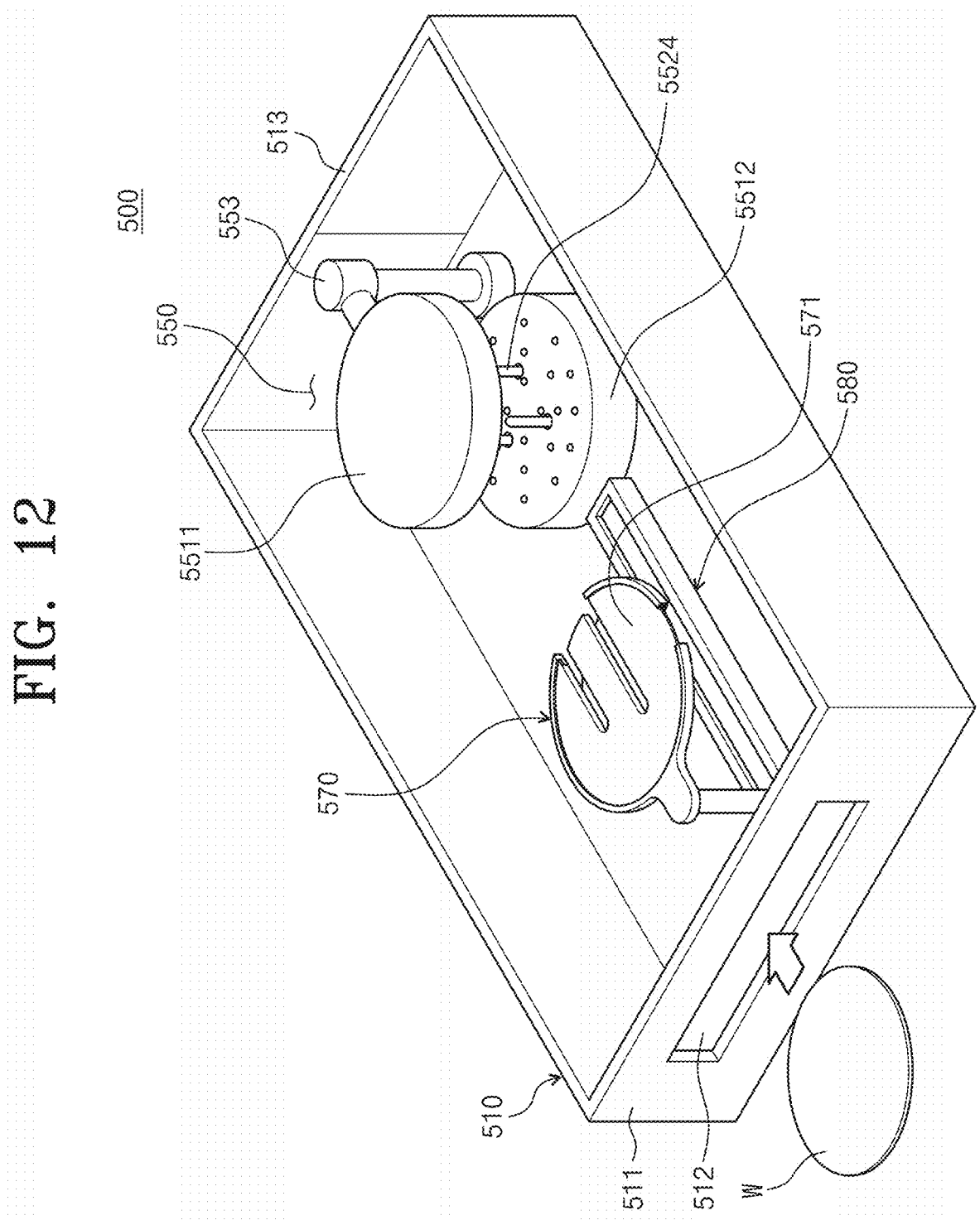
FIGS. 12 to 14 are diagrams illustrating a bake unit of a type of cooling a substrate while transferring the substrate.
Figure 13:
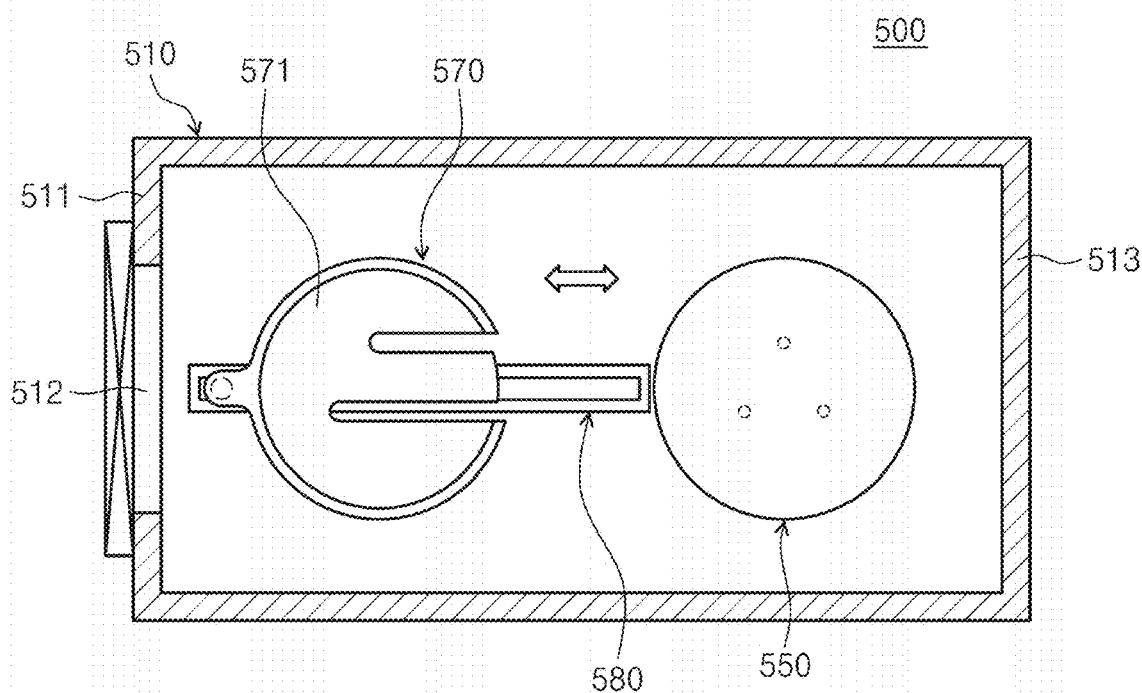
Figure 14:
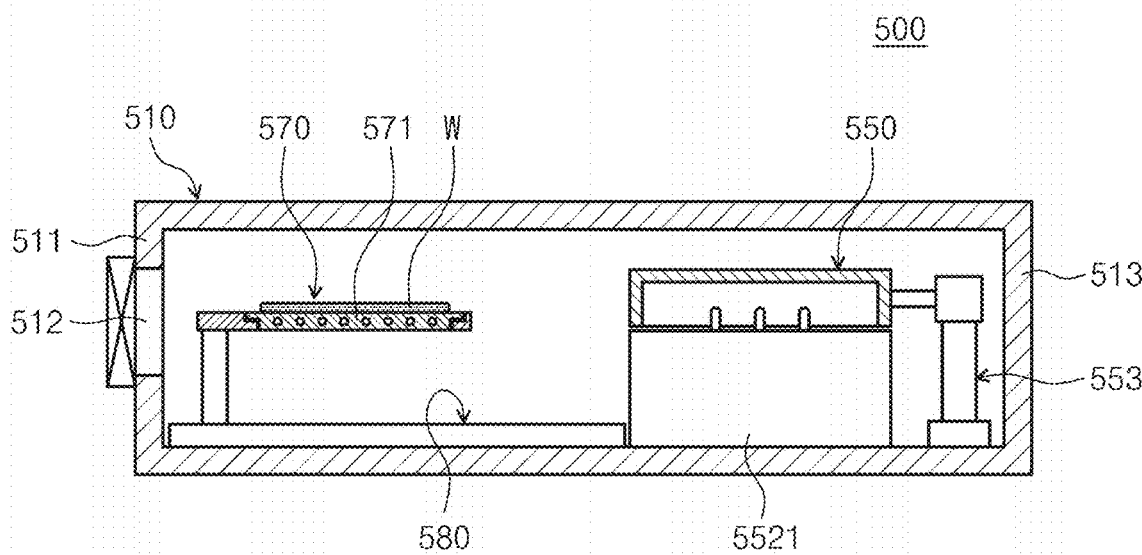

Hereinabove, it has been illustrated and described as an example that the bake unit 500 includes the cooling unit 530, the heating unit 550 and the transfer unit 570, and the transfer unit 570 only transfers the substrate W between the cooling unit 530 and the heating unit 550, and the cooling of the substrate W is performed in the cooling unit 530. However, the present invention is not limited thereto, and the main features of the present exemplary embodiment may also be applied to the bake unit in which the transfer unit 570 cools the substrate W heat-treated by the heating unit 550 during transferring. Referring to FIGS. 12 to 14, the bake unit 500 includes the heating unit 550 and the transfer unit 570. The transfer unit 570 may include the transfer plate 571 and the transfer unit 580 transferring the transfer plate 571. For example, the transfer plate 571 may be provided with a cooling passage therein. Cooling water may be supplied to the cooling passage to cool the substrate W and the transfer plate 571. The transfer unit 580 transfers the transfer plate 571 in the housing 510. The transfer plate 571 may be moved to a standby position and a cooling position by the transfer unit 580. The standby position may be a position adjacent to the entrance, and the cooling position may be a position corresponding to the upper portion of the support plate 551 of the heating unit 550. The structure of the transfer plate 571 has the same structure as the transfer plate 571 according to FIGS. 8 to 11 described above, except that a cooling passage is provided in the transfer plate 571 to cool the substrate W during transferring. That is, the transport plate 571 of FIGS. 12 to 14 may selectively include any one of the first to fourth protrusions 5741, 5742, 5743, and 5744.

The plurality of protrusions described above may be selectively provided on the support plate. That is, only the first protrusion may be provided on the support plate of the cooling unit 530 and the heating unit 550. Alternatively, only the second protrusion may be provided on the support plate of the cooling unit 530 and the heating unit 550. Alternatively, both the first protrusion and the second protrusion may be provided on the support plate of the cooling unit 530 and the heating unit 550. At least one of the first to fourth protrusions may be selectively provided on the transfer plate of the transfer unit 570. Alternatively, all of the first to fourth protrusions may be provided on the transfer plate of the transfer unit 570.

The plurality of protrusions described above may be provided only in the cooling unit 530. Alternatively, the plurality of protrusions may be provided only in the heating unit 550. Alternatively, the plurality of protrusions may be provided only in the transfer unit 570. Alternatively, the plurality of protrusions may be provided in two units of the cooling unit 530, the heating unit 550, and the transfer unit 570. Alternatively, the plurality of protrusions may be provided in all of the cooling unit 530, the heating unit 550, and the transfer unit 570.

The foregoing detailed description illustrates the present invention. Further, the above content shows and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. A transfer unit for transporting a substrate comprising:
a transfer plate which supports a substrate when the substrate is transferred;
a transfer part which transfers the transfer plate; and
a support protrusion provided on the transfer plate and configured to separate the substrate from the transfer plate,
wherein the transfer plate includes:
a slit-shaped guide groove extending inward from an edge of the transfer plate;
a first protrusion protruding from an upper surface of the transfer plate and provided in a support region provided by the support protrusion;
a second protrusion protruding from the upper surface of the transfer plate and provided in a region other than the support region where the support protrusion is provided; and
a fourth protrusion protruding from the upper surface of the transfer plate and provided at a position adjacent to the guide groove,
wherein the upper surfaces of the first protrusion, the second protrusion and fourth protrusion are positioned at a position lower than the upper surface of the support protrusion.

2. The transfer unit of claim 1,
wherein an upper surface of the first protrusion is provided flat.

3. The transfer unit of claim 2,
wherein the support protrusion is provided on the upper surface of the first protrusion.

4. The transfer unit of claim 3,
wherein heights of the first protrusion, the second protrusion and fourth protrusion are greater than a height of the support protrusion.

5. The transfer unit of claim 1,
wherein the first protrusion is positioned adjacent to the support protrusion.

6. The transfer unit of claim 5,
wherein the first protrusion is provided to surround the support protrusion in a ring shape.

7. The transfer unit of claim 1,
wherein heights of the first protrusion and the second protrusion are the same as each other.

8. The transfer unit of claim 1,
a plurality of first protrusions are provided and
wherein a plurality of second protrusions are provided between the plurality of first protrusions.

9. The transfer unit of claim 1,
wherein a plurality of support protrusions is provided, and
wherein a plurality of first protrusions are provided in a number corresponding to the support protrusions.

10. The transfer unit of claim 1,
wherein the transfer plate includes a notch formed in an edge region of the transfer plate, and
the transfer plate includes a third protrusion protruding from the upper surface of the transfer plate and provided at a position adjacent to the notch.

11. A bake apparatus comprising:
a heating unit configured to heat a substrate;
a cooling unit configured to cool the substrate heated by the heating unit; and
a transfer unit configured to transfer the substrate between the heating unit and the cooling unit;
wherein the transfer unit includes:
a transfer plate which supports a substrate when the substrate is transferred,
a transfer part which transfers the transfer plate,
a support protrusion provided on the transfer plate and configured to separate the substrate from the transfer plate; and a protrusion configured to protrude from an upper surface of the transfer plate, wherein the transfer plate includes a slit-shaped guide groove extending inward from an edge of the transfer plate, and wherein the protrusion includes:

a first protrusion provided in a support region where the support protrusion is provided a second protrusion provided in a region other than the support region and, a fourth protrusion protruding from the upper surface of the transfer plate and provided at a position adjacent to the guide groove, wherein the upper surfaces of the first protrusion, the second protrusion and fourth protrusion are positioned at a position lower than the upper surface of the support protrusion.

12. The bake apparatus of claim 11, wherein an upper surface of the first protrusion is provided flat, and the support protrusion is provided on the upper surface of the first protrusion.

13. The bake apparatus of claim 11, wherein the support protrusion is provided on the upper surface of the transfer plate, and the first protrusion is provided to surround the support protrusion in a ring shape.

14. The bake apparatus of claim 11, wherein the transfer plate includes a notch formed in an edge region of the transfer plate, and the transfer plate includes a third protrusion protruding from the upper surface of the transfer plate and provided at a position adjacent to the notch.

15. A substrate treating apparatus for treating a substrate comprising:

a bake unit configured to perform a heat treating process on the substrate;

a liquid treating unit configured to supply a liquid to the substrate to perform a process; and a transfer robot configured to transfer the substrate between the bake unit and the liquid treating unit, wherein the bake unit includes:

a housing;

a heating unit positioned in the housing and heating the substrate;

a cooling unit positioned in the housing and cooling the substrate heated by the heating unit; and a transfer unit positioned in the housing and transferring the substrate between the heating unit and the cooling unit, wherein the transfer unit includes a transfer plate on which the substrate is placed; and a first support protrusion provided on the transfer plate and configured to separate the substrate from the transfer plate, wherein the transfer plate includes:

a slit-shaped guide groove extending inward from an edge of the transfer plate, and a first protrusion protruding from an upper surface of the transfer plate, and provided in a support region provided by the first support protrusion, a second protrusion protruding from the upper surface of the transfer plate and provided in a region other than the support region where the first support protrusion is provided, and a fourth protrusion protruding from the upper surface of the transfer plate and provided at a position adjacent to the guide groove, wherein the upper surfaces of the first protrusion, the second protrusion and the fourth protrusion are positioned at a position lower than the upper surface of the first support protrusion.

16. The substrate treating apparatus of claim 15, wherein the cooling unit includes:

a cooling plate for cooling the substrate;

a cooling member provided inside the cooling plate; and a second support protrusion provided on the cooling plate and configured to separate the substrate from the cooling plate, wherein the cooling plate includes a fifth protrusion protruding upward from an upper surface of the cooling plate, and wherein the fifth protrusion is provided in a support region where the second support protrusion is provided.

17. The substrate treating apparatus of claim 16, wherein the first protrusion, the second protrusion the fourth protrusion and the fifth protrusion are provided with flat upper surfaces thereof, and the first support protrusion and the second support protrusion are provided on the upper surface of the first protrusion and the upper surface of the fifth protrusion, respectively.

18. The bake apparatus of claim 15, wherein the transfer plate includes a notch formed in an edge region of the transfer plate, and the transfer plate includes a third protrusion protruding from the upper surface of the transfer plate and provided at a position adjacent to the notch.

* * * * *